(12) United States Patent
Fuyuki et al.

(10) Patent No.: US 10,714,640 B2
(45) Date of Patent: Jul. 14, 2020

(54) SEMICONDUCTOR STACKED BODY, LIGHT-RECEIVING ELEMENT, AND METHOD FOR PRODUCING SEMICONDUCTOR STACKED BODY

(71) Applicant: SUMITOMO ELECTRIC INDUSTRIES, LTD., Osaka-shi, Osaka (JP)

(72) Inventors: Takuma Fuyuki, Itami (JP); Suguru Arikata, Itami (JP); Susumu Yoshimoto, Itami (JP); Katsushi Akita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 8 days.

(21) Appl. No.: 16/073,039

(22) PCT Filed: Jan. 24, 2017

(86) PCT No.: PCT/JP2017/002237
§ 371 (c)(1),
(2) Date: Jul. 26, 2018

(87) PCT Pub. No.: WO2017/130930
PCT Pub. Date: Aug. 3, 2017

(65) Prior Publication Data
US 2019/0035954 A1   Jan. 31, 2019

(30) Foreign Application Priority Data
Jan. 27, 2016  (JP) .................................. 2016-013121

(51) Int. Cl.
*H01L 31/0328*   (2006.01)
*H01L 21/00*     (2006.01)
(Continued)

(52) U.S. Cl.
CPC .. *H01L 31/035236* (2013.01); *H01L 21/0237* (2013.01); *H01L 21/02387* (2013.01);
(Continued)

(58) Field of Classification Search
CPC ........ H01L 31/035236; H01L 31/03046; H01L 31/101; H01L 31/1844; H01L 31/1035;
(Continued)

(56) References Cited

U.S. PATENT DOCUMENTS

| 2010/0051905 A1* | 3/2010 | Iguchi | B82Y 20/00 257/14 |
|---|---|---|---|
| 2011/0140082 A1* | 6/2011 | Iguchi | B82Y 20/00 257/14 |

(Continued)

FOREIGN PATENT DOCUMENTS

| CN | 104134712 A | 11/2014 |
|---|---|---|
| JP | 2009-283601 A | 12/2009 |

(Continued)

OTHER PUBLICATIONS

Rubin Sidhu et al., "A Long-Wavelength Photodiode on InP Using Lattice-Matched GaInAs—GaAsSb Type-II Quantum Wells," IEEE Photonics Technology Letters, Dec. 2005, pp. 2715-2717, vol. 17, No. 12.

*Primary Examiner* — Shouxiang Hu
(74) *Attorney, Agent, or Firm* — Faegre Drinker Biddle & Reath LLP

(57) ABSTRACT

A semiconductor stacked body includes: a first semiconductor layer containing a group III-V compound semiconductor and being a layer whose conductivity type is a first conductivity type; a quantum-well light-receiving layer containing a group III-V compound semiconductor; a second semiconductor layer containing a group III-V compound semiconductor; and a third semiconductor layer containing a group (Continued)

III-V compound semiconductor and being a layer whose conductivity type is a second conductivity type. The first semiconductor layer, the quantum-well light-receiving layer, the second semiconductor layer, and the third semiconductor layer are stacked in this order. The concentration of an impurity that generates a carrier of the second conductivity type is $1 \times 10^{14}$ cm$^{-3}$ or more and $1 \times 10^{17}$ cm$^{-3}$ or less in the second semiconductor layer.

20 Claims, 5 Drawing Sheets

(51) Int. Cl.
*H01L 31/0352* (2006.01)
*H01L 31/0304* (2006.01)
*H01L 31/103* (2006.01)
*H01L 21/02* (2006.01)
*H01L 31/101* (2006.01)
*H01L 31/18* (2006.01)
*B82Y 20/00* (2011.01)

(52) U.S. Cl.
CPC .... *H01L 21/02505* (2013.01); *H01L 31/0304* (2013.01); *H01L 31/03042* (2013.01); *H01L 31/03046* (2013.01); *H01L 31/035209* (2013.01); *H01L 31/101* (2013.01); *H01L 31/103* (2013.01); *H01L 31/1844* (2013.01); *B82Y 20/00* (2013.01)

(58) Field of Classification Search
CPC ......... H01L 31/035209; H01L 31/0304; H01L 31/03042; H01L 21/02389; H01L 21/02505; H01L 21/0237; B82Y 20/00
See application file for complete search history.

(56) References Cited

U.S. PATENT DOCUMENTS

| | | |
|---|---|---|
| 2012/0223290 A1 | 9/2012 | Iguchi et al. |
| 2012/0298957 A1* | 11/2012 | Iguchi ................ H01L 27/1464 257/21 |
| 2013/0313521 A1* | 11/2013 | Akita ............. H01L 31/035209 257/21 |
| 2016/0247951 A1 | 8/2016 | Fujii et al. |

FOREIGN PATENT DOCUMENTS

| | | |
|---|---|---|
| WO | WO-2010/073768 A1 | 7/2010 |
| WO | WO-2015/059988 A1 | 4/2015 |

* cited by examiner

SEMICONDUCTOR STACKED BODY, LIGHT-RECEIVING ELEMENT, AND METHOD FOR PRODUCING SEMICONDUCTOR STACKED BODY

TECHNICAL FIELD

The present invention relates to a semiconductor stacked body, a light-receiving element, and a method for producing a semiconductor stacked body.

This application claims priority to Japanese Patent Application No. 2016-013121 filed Jan. 27, 2016, which is incorporated herein by reference in its entirety.

BACKGROUND ART

Conventional semiconductor stacked bodies containing group III-V compound semiconductors can be used to produce light-receiving elements that can receive infrared light. Specifically, a light-receiving element for infrared light can be produced by, for example, sequentially stacking a buffer layer, a quantum-well light-receiving layer, and a contact layer, each of which contains a group III-V compound semiconductor, on a substrate containing a group III-V compound semiconductor, and further forming suitable electrodes. Such a light-receiving element has been reported to be a photodiode with cutoff wavelengths from 2 μm to 5 μm (see, for example, Non Patent Literature 1).

CITATION LIST

Non Patent Literature

NPL 1: R. Sidhu, et. al., "A Long-Wavelength Photodiode on InP Using Lattice-Matched GaInAs-GaAsSb Type-II Quantum Wells", IEEE PHOTONICS TECHNOLOGY LETTERS, VOL. 17, NO. 12, DECEMBER 2005, p. 2715-2717

SUMMARY OF INVENTION

A semiconductor stacked body according to the present invention includes: a first semiconductor layer containing a group III-V compound semiconductor and being a layer whose conductivity type is a first conductivity type; a quantum-well light-receiving layer containing a group III-V compound semiconductor; a second semiconductor layer containing a group III-V compound semiconductor; and a third semiconductor layer containing a group III-V compound semiconductor and being a layer whose conductivity type is a second conductivity type different from the first conductivity type. The first semiconductor layer, the quantum-well light-receiving layer, the second semiconductor layer, and the third semiconductor layer are stacked in this order. The concentration of an impurity that generates a carrier of the second conductivity type is $1 \times 10^{14}$ cm$^{-3}$ or more and $1 \times 10^{17}$ cm$^{-3}$ or less in the second semiconductor layer.

A method for producing the semiconductor stacked body according to the present invention includes: a step of forming a first semiconductor layer containing a group III-V compound semiconductor and being a layer whose conductivity type is a first conductivity type; a step of forming a quantum-well light-receiving layer containing a group III-V compound semiconductor; a step of forming a second semiconductor layer containing a group III-V compound semiconductor; and a step of forming a third semiconductor layer containing a group III-V compound semiconductor and being a layer whose conductivity type is a second conductivity type different from the first conductivity type. The step of forming a first semiconductor layer, the step of forming a quantum-well light-receiving layer, the step of forming a second semiconductor layer, and the step of forming a third semiconductor layer are performed in this order. The first semiconductor layer, the quantum-well light-receiving layer, the second semiconductor layer, and the third semiconductor layer are stacked in this order. The second semiconductor layer is formed such that the concentration of an impurity that generates a carrier of the second conductivity type is $1 \times 10^{14}$ cm$^{-3}$ or more and $1 \times 10^{17}$ cm$^{-3}$ or less.

DESCRIPTION OF EMBODIMENTS

Figure 1:
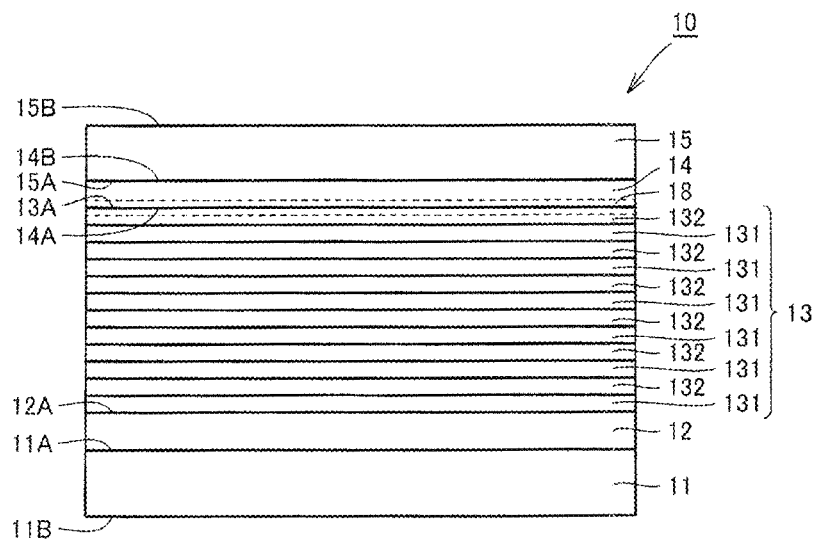
FIG. 1 is a schematic sectional view illustrating the structure of a semiconductor stacked body according to a first embodiment.

[Problem to be solved by Present Disclosure]

Conventional light-receiving elements including semiconductor layers each containing a group III-V compound semiconductor as described above may suffer from low sensitivity. An object of the present invention is to provide a semiconductor stacked body capable of contributing to an improvement in the sensitivity of a light-receiving element including semiconductor layers each containing a group III-V compound semiconductor and to provide a light-receiving element.

[Advantageous Effects of Present Disclosure]

According to a semiconductor stacked body and a method for producing the semiconductor stacked body in the present invention, the sensitivity of a light-receiving element including semiconductor layers each containing a group III-V compound semiconductor can be improved.

[Description of Embodiments of Invention]

First, embodiments of the present invention will be described. A semiconductor stacked body in this application includes: a first semiconductor layer containing a group III-V compound semiconductor and being a layer whose conductivity type is a first conductivity type; a quantum-well light-receiving layer containing a group III-V compound semiconductor; a second semiconductor layer containing a group III-V compound semiconductor; and a third semiconductor layer containing a group III-V compound semiconductor and being a layer whose conductivity type is a second conductivity type different from the first conductivity type. The first semiconductor layer, the quantum-well light-receiving layer, the second semiconductor layer, and the third semiconductor layer are stacked in this order. The concentration of an impurity that generates a carrier of the second conductivity type is $1 \times 10^{14}$ cm$^{-3}$ or more and $1 \times 10^{17}$ cm$^{-3}$ or less in the second semiconductor layer.

The inventors of the present invention have studied a measure to increase the sensitivity of a light-receiving element having a structure in which a first conductivity-type semiconductor layer containing a group III-V compound semiconductor and a second conductivity-type semiconductor layer containing a group III-V compound semiconductor are disposed with a quantum-well light-receiving layer containing a group III-V compound semiconductor interposed between the first conductivity-type semiconductor layer and the second conductivity-type semiconductor layer. As a result, it has been found that an impurity introduced to the semiconductor layer to generate many carriers diffuses into the quantum-well light-receiving layer and lowers the sensitivity. To inhibit such impurity diffusion, a low-impurity-concentration semiconductor layer with a low impurity concentration may be disposed between the semiconductor layer and the quantum-well light-receiving layer. However, when a structure having a low-impurity-concentration semiconductor layer with a low impurity concentration is simply employed, carriers are generated in the low-impurity-concentration semiconductor layer and inhibit the spread of a depletion layer. This results in an issue of low sensitivity of the light-receiving element. According to the studies of the inventors, appropriate control of the concentration of an impurity in the low-impurity-concentration semiconductor layer allows the low-impurity-concentration semiconductor layer to inhibit the diffusion of the impurity from the semiconductor layer to the quantum-well light-receiving layer and reduces generation of carriers in the low-impurity-concentration semiconductor layer. As a result, the sensitivity of the light-receiving element can be increased.

In the semiconductor stacked body in this application, a second semiconductor layer, which is a low-impurity-concentration semiconductor layer, is disposed between a quantum-well light-receiving layer and a third semiconductor layer, which are semiconductor layers. The impurity concentration of the second semiconductor layer is set to $1 \times 10^{14}$ cm$^{-3}$ or more and $1 \times 10^{17}$ cm$^{-3}$ or less. Therefore, the second semiconductor layer can inhibit the diffusion of the impurity from the third semiconductor layer into the quantum-well light-receiving layer, while generation of carriers can be reduced in the second semiconductor layer. As a result, a light-receiving element produced by using the semiconductor stacked body in this application has high sensitivity. According to the semiconductor stacked body in this application, a semiconductor stacked body capable of contributing to an improvement in the sensitivity of a light-receiving element including semiconductor layers each containing a group III-V compound semiconductor can be provided.

The semiconductor stacked body includes an interface region, which is a region including the interface between the quantum-well light-receiving layer and the second semiconductor layer. The interface region may have a higher concentration of an impurity that generates a carrier of the second conductivity type than a region in the quantum-well light-receiving layer and a region in the second semiconductor layer, these regions being adjacent to the interface region. With such a configuration, generation of the carrier can be reduced at the interface between the second semiconductor layer and the quantum-well light-receiving layer.

In the interface region in the semiconductor stacked body, the concentration of the impurity that generates a carrier of the second conductivity type may be $1 \times 10^{15}$ cm$^{-3}$ or more and $1 \times 10^{18}$ cm$^{-3}$ or less. With such an impurity concentration, generation of the carrier can be reduced assuredly at the interface between the second semiconductor layer and the quantum-well light-receiving layer.

In the third semiconductor layer in the semiconductor stacked body, the concentration of an impurity that generates a carrier of the second conductivity type may be $1 \times 10^{18}$ cm$^{-3}$ or more and $1 \times 10^{20}$ cm$^{-3}$ or less. When the concentration of the impurity is $1 \times 10^{18}$ cm$^{-3}$ or more, it is easy to ensure an ohmic contact in forming an electrode in contact with the third semiconductor layer. When the concentration of the impurity is $1 \times 10^{20}$ cm$^{-3}$ or less, it is easy to inhibit the diffusion of the impurity from the third semiconductor layer into the second semiconductor layer and to control the concentration of the impurity in the second semiconductor layer in a suitable range.

In the semiconductor stacked body, the impurity that generates a carrier of the second conductivity type in the third semiconductor layer may be one or more selected from the group consisting of Si (silicon), S (sulfur), Se (selenium), Ge (germanium), Te (tellurium), and Sn (tin) or may be one or more selected from the group consisting of Zn (zinc), Be (beryllium), Mg (magnesium), and C (carbon). These impurities are suitable as an n-type impurity or a p-type impurity in the third semiconductor layer containing a group III-V compound semiconductor.

In the semiconductor stacked body, the third semiconductor layer may contain InP. InP is suitable as a group III-V compound semiconductor in the third semiconductor layer.

In the semiconductor stacked body, the quantum-well light-receiving layer may contain an impurity at a concentration of $1 \times 10^{14}$ cm$^{-3}$ or more and $1 \times 10^{17}$ cm$^{-3}$ or less, the impurity being an impurity that generates a carrier of the first conductivity type or an impurity that generates a carrier of the second conductivity type. In the case where a carrier of one of p-type and n-type is generated in the quantum-well light-receiving layer, an impurity that generates a carrier of the other n-type or p-type is introduced into the quantum-well light-receiving layer to lower the carrier concentration of the quantum-well light-receiving layer and ensure high sensitivity.

In the semiconductor stacked body, the quantum-well light-receiving layer may have a thickness of 0.5 μm or more. Such a thickness makes it easy to produce a light-receiving element with high sensitivity by using the semiconductor stacked body.

In the semiconductor stacked body, the quantum-well light-receiving layer may have a type-II quantum well structure. Such a structure makes the semiconductor stacked body suitable for a light-receiving element that can receive infrared light.

In the semiconductor stacked body, the quantum-well light-receiving layer may have a multiple quantum well structure including a pair of an $In_xGa_{1-x}As$ (indium gallium arsenide; x is 0.38 or more and 1 or less) layer and a $GaAs_{1-y}Sb_y$ (gallium arsenide antimonide; y is 0.36 or more and 1 or less) layer or a pair of a $Ga_{1-u}In_uN_vAs_{1-v}$ (gallium indium nitrogen arsenide; u is 0.4 or more and 0.8 or less, v is more than 0 and 0.2 or less) layer and a $GaAs_{1-y}Sb_y$ (y is 0.36 or more and 0.62 or less) layer. Such a structure makes the semiconductor stacked body suitable for a light-receiving element that can receive near-infrared light to mid-wavelength infrared light.

The semiconductor stacked body may further include a substrate disposed on the opposite side of the first semiconductor layer from the quantum-well light-receiving layer. The substrate may contain GaAs (gallium arsenide), GaP (gallium phosphide), GaSb (gallium antimonide), InP (indium phosphide), InAs (indium arsenide), InSb (indium antimonide), AlSb (aluminum antimonide), or AlAs (aluminum arsenide). Such a substrate makes it easy to use the quantum-well light-receiving layer suitable for detection of near-infrared light to mid-wavelength infrared light.

The semiconductor stacked body may further include a substrate disposed on the opposite side of the first semiconductor layer from the quantum-well light-receiving layer. The second semiconductor layer may contain a group III-V compound semiconductor capable of having a lattice constant equal to that of the substrate. The lattice constant can be made close to that of the substrate, for example, by controlling the proportions of constituent elements through selection of a material capable of having a lattice constant equal to that of the substrate as a material of the second semiconductor layer. This can reduce or eliminate occurrence of distortion in the quantum-well light-receiving layer that would be caused by a difference in lattice constant. To obtain the same advantageous effects, the second semiconductor layer may contain the same group III-V compound semiconductor as semiconductor layers in the quantum-well light-receiving layer.

In the semiconductor stacked body, the concentration of oxygen, the concentration of carbon, and the concentration of hydrogen may be each $1 \times 10^{17}$ cm$^{-3}$ or less at the interface between the first semiconductor layer and the quantum-well light-receiving layer, the interface between the quantum-well light-receiving layer and the second semiconductor layer, and the interface between the second semiconductor layer and the third semiconductor layer. This configuration can reduce the dark current of a light-receiving element produced by using the semiconductor stacked body.

In the semiconductor stacked body, the first semiconductor layer, the quantum-well light-receiving layer, the second semiconductor layer, and the third semiconductor layer may be stacked without formation of a regrown interface. This configuration can reduce the dark current of a light-receiving element produced by using the semiconductor stacked body. The regrown interface is an interface where at least one element selected from the group consisting of oxygen, hydrogen, and carbon accumulates. At the regrown interface, the concentration of at least one element selected from the group consisting of oxygen, hydrogen, and carbon is, for example, higher than $1 \times 10^{17}$ cm$^{-3}$.

The light-receiving element in this application includes the semiconductor stacked body and an electrode formed on the semiconductor stacked body. The light-receiving element in this application includes the semiconductor stacked body in this application. Therefore, the light-receiving element in this application has high sensitivity.

A method for producing the semiconductor stacked body in this application includes: a step of forming a first semiconductor layer containing a group III-V compound semiconductor and being a layer whose conductivity type is a first conductivity type; a step of forming a quantum-well light-receiving layer containing a group III-V compound semiconductor; a step of forming a second semiconductor layer containing a group III-V compound semiconductor; and a step of forming a third semiconductor layer containing a group III-V compound semiconductor and being a layer whose conductivity type is a second conductivity type different from the first conductivity type. The step of forming a first semiconductor layer, the step of forming a quantum-well light-receiving layer, the step of forming a second semiconductor layer, and the step of forming a third semiconductor layer are performed in this order. The first semiconductor layer, the quantum-well light-receiving layer, the second semiconductor layer, and the third semiconductor layer are stacked in this order. The second semiconductor layer is formed such that the concentration of an impurity that generates a carrier of the second conductivity type is $1 \times 10^{14}$ cm$^{-3}$ or more and $1 \times 10^{17}$ cm$^{-3}$ or less.

In the method for producing a semiconductor stacked body in this application, the second semiconductor layer having an impurity concentration of $1 \times 10^{14}$ cm$^{-3}$ or more and $1 \times 10^{17}$ cm$^{-3}$ or less is formed between the third semiconductor layer and the quantum-well light-receiving layer. Therefore, the second semiconductor layer can inhibit the diffusion of the impurity from the third semiconductor layer into the quantum-well light-receiving layer, while generation of the carrier can be reduced in the second semiconductor layer. As a result, the light-receiving element produced by using the semiconductor stacked body has high sensitivity. According to the method for producing a semiconductor stacked body in this application, a semiconductor stacked body capable of contributing to an improvement in the sensitivity of a light-receiving element including semiconductor layers each containing a group III-V compound semiconductor can be produced.

In the step of forming a third semiconductor layer in the method for producing a semiconductor stacked body, the third semiconductor layer may be formed such that the impurity contained in the third semiconductor layer diffuses into the second semiconductor layer, the impurity being an impurity that generates a carrier of the second conductivity type. The impurity concentration of the second semiconductor layer can be controlled accordingly in the step of forming a third semiconductor layer.

In the method for producing a semiconductor stacked body, the step of forming a first semiconductor layer, the step of forming a quantum-well light-receiving layer, the step of forming a second semiconductor layer, and the step of forming a third semiconductor layer may be performed such that the first semiconductor layer, the quantum-well light-receiving layer, the second semiconductor layer, and the third semiconductor layer are stacked without formation of a regrown interface. This configuration can reduce the dark current of a light-receiving element produced by using the semiconductor stacked body.

In the method for producing a semiconductor stacked body, the step of forming a first semiconductor layer, the step of forming a quantum-well light-receiving layer, the step of forming a second semiconductor layer, and the step of forming a third semiconductor layer may be performed by using metalorganic vapor phase epitaxy. Using such a method makes it easy to form a first semiconductor layer, a quantum-well light-receiving layer, a second semiconductor layer, and a third semiconductor layer each containing a high quality crystal.

The method for producing a semiconductor stacked body may further include, after the step of forming a third semiconductor layer, a step of diffusing the impurity contained in the third semiconductor layer into the second semiconductor layer by a heat treatment, the impurity being an impurity that generates a carrier of the second conductivity type. The impurity concentration of the second semiconductor layer can be thus controlled by the heat treatment.

In the method for producing a semiconductor stacked body, the heat treatment may involve heating to a temperature of 400° C. or higher and 700° C. or lower and maintaining the temperature for 10 minutes or longer and 120 minutes or shorter. It is thus easy to control the impurity concentration of the second semiconductor layer by the heat treatment.

[Detailed Description of Embodiments of Invention]

Next, embodiments of a semiconductor stacked body according to the present invention will be described below with reference to the drawings. In the following drawings, any identical or corresponding elements will be assigned with the same reference characters, and no redundant description thereof will be provided.

(First Embodiment)

Referring to FIG. 1, a semiconductor stacked body 10 in a first embodiment includes a substrate 11, a first semiconductor layer 12, a quantum well structure 13, which serves as a quantum-well light-receiving layer, a second semiconductor layer 14, and a third semiconductor layer 15.

The substrate 11 contains a group III-V compound semiconductor. The substrate 11 has a diameter of 50 mm or more, for example, 3 inches. The group III-V compound semiconductor in the substrate 11 may be, for example, GaAs, GaP, GaSb, InP, InAs, InSb, AlSb, or AlAs. The use of the substrate 11 containing such a group III-V compound semiconductor can provide the semiconductor stacked body 10 suitable for production of a light-receiving element for infrared light.

Specifically, for example, InP(n-InP), whose conductivity type is n-type, is used as a compound semiconductor in the substrate 11. For example, S (sulfur) can be used as an n-type impurity in the substrate 11. The diameter of the substrate 11 may be 80 mm or more (e.g., 4 inches), or 100 mm or more (e.g., 5 inches), or 130 mm or more (e.g., 6 inches) for the purpose of improving the production efficiency and the yield of a semiconductor device (light-receiving element) including the semiconductor stacked body 10.

The first semiconductor layer 12 is a semiconductor layer disposed on and in contact with a main surface 11A of the substrate 11. The first semiconductor layer 12 contains a group III-V compound semiconductor. The group III-V compound semiconductor in the first semiconductor layer 12 may be, for example, a binary material, such as GaSb, AlSb, or InSb, or a ternary material, such as GaInSb (gallium indium antimonide), AlInSb (aluminum indium antimonide), AlGaSb (aluminum gallium antimonide), InGaAs (indium gallium arsenide), or GaAsSb (gallium arsenide antimonide). Specifically, InGaAs (n-InGaAs), whose conductivity type is n-type, is used as a compound semiconductor in the first semiconductor layer 12. For example, Si, S, Se, Ge, Te, or Sn can be used as an n-type impurity in the first semiconductor layer 12.

The quantum well structure 13 is disposed on and in contact with a first main surface 12A of the first semiconductor layer 12 opposite to a surface that faces the substrate 11. The quantum well structure 13 has a structure where two element layers each containing a group III-V compound semiconductor are stacked alternately. More specifically, the quantum well structure 13 has a structure in which a first element layer 131 and a second element layer 132 are stacked alternately. The first element layer 131 may be made of, for example, $In_xGa_{1-x}As$ (x is 0.38 or more and 1 or less). The second element layer 132 may be made of, for example, $GaAs_{1-y}Sb_y$ (y is 0.36 or more and 1 or less). The materials of the first element layer 131 and the second element layer 132 are not limited to the above-described materials. For example, the first element layer 131 may be made of $Ga_{1-u}In_uN_vAs$ (u is 0.4 or more and 0.8 or less, and v is more than 0 and 0.2 or less), and the second element layer 132 may be made of, for example, $GaAs_{1-y}Sb_y$ (y is 0.36 or more and 0.62 or less).

As described above, the quantum-well light-receiving layer may have a multiple quantum well structure including a pair of an $In_xGa_{1-x}As$ (x is 0.38 or more and 1 or less) layer and a $GaAs_{1-y}Sb_y$ (y is 0.36 or more and 1 or less) layer or a pair of a $Ga_{1-u}In_uN_vAs_{1-v}$ (u is 0.4 or more and 0.8 or less, and v is more than 0 and 0.2 or less) layer and a $GaAs_{1-y}Sb_y$ (y is 0.36 or more and 0.62 or less) layer. This configuration can provide the semiconductor stacked body 10 that can be used to produce a light-receiving element suitable for detection of near-infrared light to mid-wavelength infrared light. The first element layer 131 and the second element layer 132 each may have a thickness of, for example, 5 nm. The quantum well structure 13 may have, for example, a stack of 250 unit structures each including the first element layer 131 and the second element layer 132. In other words, the quantum well structure 13 may have a thickness of, for example, 2.5 μm.

The first element layer 131 may be made of InAs, and the second element layer 132 may be made of GaSb. When the quantum-well light-receiving layer has a multiple quantum well structure including a pair of an InAs layer and a GaSb layer, this structure can provide the semiconductor stacked body 10 that can be used to produce a light-receiving element suitable for detection of infrared light with wavelengths from 4 to 12 μm.

To compensate for distortion of the quantum well structure 13, the unit structure in the quantum well structure 13 may further include a distortion compensation layer in addition to the first element layer 131 and the second element layer 132. In this embodiment, the quantum well structure 13 has a multiple quantum well structure but instead may have a single quantum well structure.

Referring to FIG. 1, the second semiconductor layer 14 is disposed on and in contact with a main surface 13A of the quantum well structure 13 opposite to a surface that faces the first semiconductor layer 12. The second semiconductor layer 14 contains a group III-V compound semiconductor. The second semiconductor layer 14 has one main surface 14A in contact with the quantum well structure 13 and the other main surface 14B in contact with the third semiconductor layer 15.

The group III-V compound semiconductor in the second semiconductor layer 14 may be the same group III-V compound semiconductor as that for the first element layer 131 or the second element layer 132 in the quantum well structure 13. The concentration of a p-type impurity in the second semiconductor layer 14 is $1\times10^{14}$ $cm^{-3}$ or more and $1\times10^{17}$ $cm^{-3}$ or less. The concentration of the p-type impurity in the second semiconductor layer 14 may be $1\times10^{14}$ $cm^{-3}$ or more and $1\times10^{16}$ $cm^{-3}$ or less. The p-type impurity contained in the second semiconductor layer 14 may be, for example, one or more selected from the group consisting of Zn, Be, Mg, and C.

The third semiconductor layer 15 is formed on and in contact with a main surface 14B of the second semiconductor layer 14 opposite to a surface that faces the quantum well structure 13. The third semiconductor layer 15 has one main surface 15A in contact with the second semiconductor layer 14. The third semiconductor layer 15 contains a group III-V compound semiconductor whose conductivity type is p-type.

Examples of the group III-V compound semiconductor in the third semiconductor layer 15 include InP, InAs, GaSb, GaAs, and InGaAs. Specifically, for example, InP(p-InP), whose conductivity type is p-type, is used as the compound semiconductor in the third semiconductor layer 15. Examples of the p-type impurity contained in the third semiconductor layer 15 include Zn, Be, Mg, and C.

In the semiconductor stacked body 10 according to the embodiment, the second semiconductor layer 14 having an impurity concentration of $1 \times 10^{14}$ cm$^{-3}$ or more and $1 \times 10^{17}$ cm$^{-3}$ or less is disposed between the third semiconductor layer 15 and the quantum well structure 13. Therefore, the second semiconductor layer 14 can inhibit the diffusion of the impurity from the third semiconductor layer 15 into the quantum well structure 13, while generation of carriers can be reduced in the second semiconductor layer 14. As a result, the light-receiving element produced by using the semiconductor stacked body 10 has high sensitivity. Thus, the semiconductor stacked body 10 contributes to an improvement in the sensitivity of a light-receiving element including semiconductor layers each containing a group III-V compound semiconductor.

The semiconductor stacked body 10 includes an interface region 18, which is a region including the interface between the quantum well structure 13 and the second semiconductor layer 14. The interface region 18 preferably has a higher p-type impurity concentration than a region in the quantum well structure 13 and a region in the second semiconductor layer 14, these regions being adjacent to the interface region 18. With such a configuration, generation of carriers can be reduced at the interface between the second semiconductor layer 14 and the quantum well structure 13.

The p-type impurity concentration of the interface region 18 is preferably $1 \times 10^{15}$ cm$^{-3}$ or more and $1 \times 10^{18}$ cm$^{-3}$ or less. With such an impurity concentration, generation of carriers can be reduced assuredly at the interface between the second semiconductor layer 14 and the quantum well structure 13.

The p-type impurity concentration of the third semiconductor layer 15 is preferably $1 \times 10^{18}$ cm$^{-3}$ or more and $1 \times 10^{20}$ cm$^{-3}$ or less. When the impurity concentration is $1 \times 10^{18}$ cm$^{-3}$ or more, it is easy to ensure an ohmic contact in forming an electrode in contact with the third semiconductor layer 15. When the impurity concentration is $1 \times 10^{20}$ cm$^{-3}$ or less, it is easy to inhibit the diffusion of the impurity from the third semiconductor layer 15 into the second semiconductor layer 14 and to control the concentration of the impurity in the second semiconductor layer 14 in a suitable range.

The p-type impurity in the third semiconductor layer 15 may be, for example, one or more selected from the group consisting of Zn, Be, Mg, and C. These impurities are suitable as a p-type impurity in the third semiconductor layer 15 containing a group III-V compound semiconductor.

The quantum well structure 13 may contain a p-type impurity or an n-type impurity at a concentration of $1 \times 10^{14}$ cm$^{-3}$ or more and $1 \times 10^{17}$ cm$^{-3}$ or less. In the case where a carrier of one of p-type and n-type is generated in the quantum well structure 13, an impurity that generates a carrier of the other n-type or p-type is introduced into the quantum well structure 13 to lower the carrier concentration of the quantum well structure 13 and ensure high sensitivity. The quantum well structure 13 may contain a p-type impurity or an n-type impurity at a concentration of $1 \times 10^{14}$ cm$^{-3}$ or more and $1 \times 10^{16}$ cm$^{-3}$ or less.

In the semiconductor stacked body 10, the quantum well structure 13 preferably has a thickness of 0.5 µm or more. Such a thickness makes it easy to produce a light-receiving element with high sensitivity by using the semiconductor stacked body 10.

The quantum well structure 13 may have a type-II quantum well structure. Such a structure makes the semiconductor stacked body 10 suitable for a light-receiving element that can receive light.

In the semiconductor stacked body 10, the concentration of oxygen, the concentration of carbon, and the concentration of hydrogen are each preferably $1 \times 10^{17}$ cm$^{-3}$ or less at the interface between the first semiconductor layer 12 and the quantum well structure 13, the interface between the quantum well structure 13 and the second semiconductor layer 14, and the interface between the second semiconductor layer 14 and the third semiconductor layer 15. This configuration can reduce the dark current of a light-receiving element produced by using the semiconductor stacked body 10.

In the semiconductor stacked body 10, the first semiconductor layer 12, the quantum well structure 13, the second semiconductor layer 14, and the third semiconductor layer 15 are preferably stacked without formation of a regrown interface. This configuration can reduce the dark current of a light-receiving element produced by using the semiconductor stacked body 10.

In the description of the embodiment, the conductivity type of the substrate 11 and the first semiconductor layer 12 is n-type, and the conductivity type of the third semiconductor layer 15 is p-type. However, the conductivity type of the substrate 11 and the first semiconductor layer 12 may be p-type, and the conductivity type of the third semiconductor layer 15 may be n-type. In this case, the n-type impurity contained in the third semiconductor layer 15 may be, for example, one or more selected from the group consisting of Si, S, Se, Ge, Te, and Sn.

Figure 2:
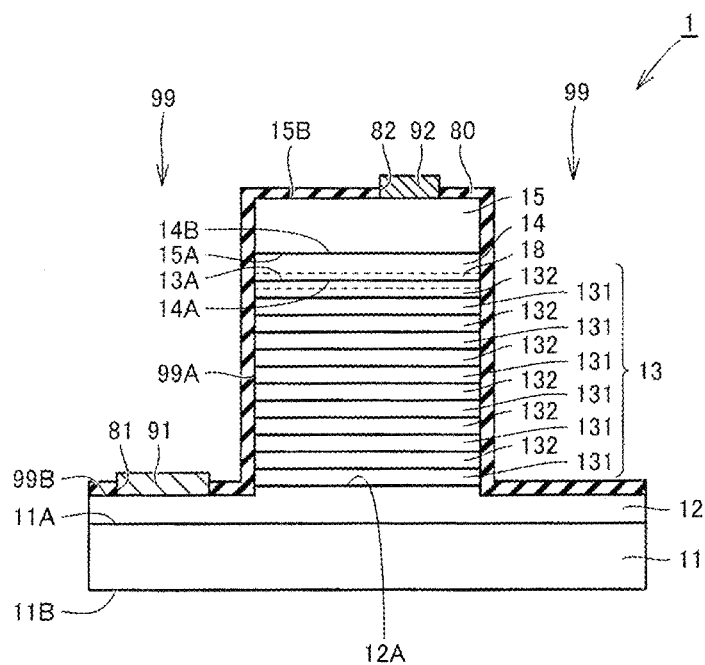
FIG. 2 is a schematic sectional view illustrating the structure of a light-receiving element according to the first embodiment.

Next, an infrared light-receiving element (photodiode), which is an example light-receiving element produced by using the semiconductor stacked body 10, will be described. Referring to FIG. 2, an infrared light-receiving element 1 in this embodiment is produced by using the semiconductor stacked body 10 of the above-described embodiment. Like the semiconductor stacked body 10, the infrared light-receiving element 1 includes a stack of a substrate 11, a first semiconductor layer 12, a quantum well structure 13, a second semiconductor layer 14, and a third semiconductor layer 15. The infrared light-receiving element 1 has a trench 99. The trench 99 passes through the third semiconductor layer 15, the second semiconductor layer 14, and the quantum well structure 13 and reaches the first semiconductor layer 12. The trench has a side wall 99A on which the third semiconductor layer 15, the second semiconductor layer 14, and the quantum well structure 13 are exposed. The trench 99 has a bottom wall 99B located in the first semiconductor layer 12. In other words, the trench 99 has a bottom wall 99B on which the first semiconductor layer 12 is exposed.

The infrared light-receiving element 1 further includes a passivation film 80, an n-side electrode 91, and a p-side electrode 92. The passivation film 80 is disposed to cover the bottom wall 99B of the trench 99, the side wall 99A of the trench 99, and a main surface 15B of the third semiconductor layer 15 opposite to a surface that faces the second semiconductor layer 14. The passivation film 80 contains an insulating material, such as silicon nitride or silicon oxide.

The passivation film 80 that covers the bottom wall 99B of the trench 99 has an opening 81, which passes through the passivation film 80 in the thickness direction. The n-side electrode 91 is disposed such that the opening 81 is filled with the n-side electrode 91. The n-side electrode 91 is disposed in contact with the first semiconductor layer 12 exposed from the opening 81. The n-side electrode 91 contains a conductive material, such as metal. More specifically, the n-side electrode 91 may contain, for example, Ti (titanium)/Pt (platinum)/Au (gold). The n-side electrode 91 is in ohmic contact with the first semiconductor layer 12.

The passivation film 80 that covers the main surface 15B of the third semiconductor layer 15 has an opening 82, which passes through the passivation film 80 in the thickness direction. The p-side electrode 92 is disposed such that the opening 82 is filled with the p-side electrode 92. The p-side electrode 92 is disposed in contact with the third semiconductor layer 15 exposed from the opening 82. The p-side electrode 92 contains a conductive material, such as metal. More specifically, the p-side electrode 92 may contain, for example, Ti/Pt/Au. The p-side electrode 92 is in ohmic contact with the third semiconductor layer 15.

When infrared light enters the infrared light-receiving element 1, infrared light is absorbed between quantum levels in the quantum well structure 13, resulting in generation of electron-hole pairs. The generated electrons and holes are then outputted from the infrared light-receiving element 1 as photocurrent signals, whereby infrared light is detected.

The p-side electrode 92 is a pixel electrode. The infrared light-receiving element 1 may include only one p-side electrode 92, which is a pixel electrode, as illustrated in FIG. 2 or may include plural pixel electrodes (p-side electrodes 92). Specifically, the infrared light-receiving element 1 may include plural unit structures each illustrated in FIG. 2. The unit structure is repeated in the direction in which one main surface 11A of the substrate 11 extends in FIG. 2. In this case, the infrared light-receiving element 1 has plural p-side electrodes 92 corresponding to the respective pixels, while the infrared light-receiving element 1 has only one n-side electrode 91. This configuration will be described below in a second embodiment.

The infrared light-receiving element 1 in this embodiment includes the semiconductor stacked body 10 of the above-described embodiment. Therefore, the infrared light-receiving element 1 is a light-receiving element with high sensitivity.

Referring next to FIGS. 3 to 8, an overview of a method for producing the semiconductor stacked body 10 and the infrared light-receiving element 1 in this embodiment will be described.

Figure 3:
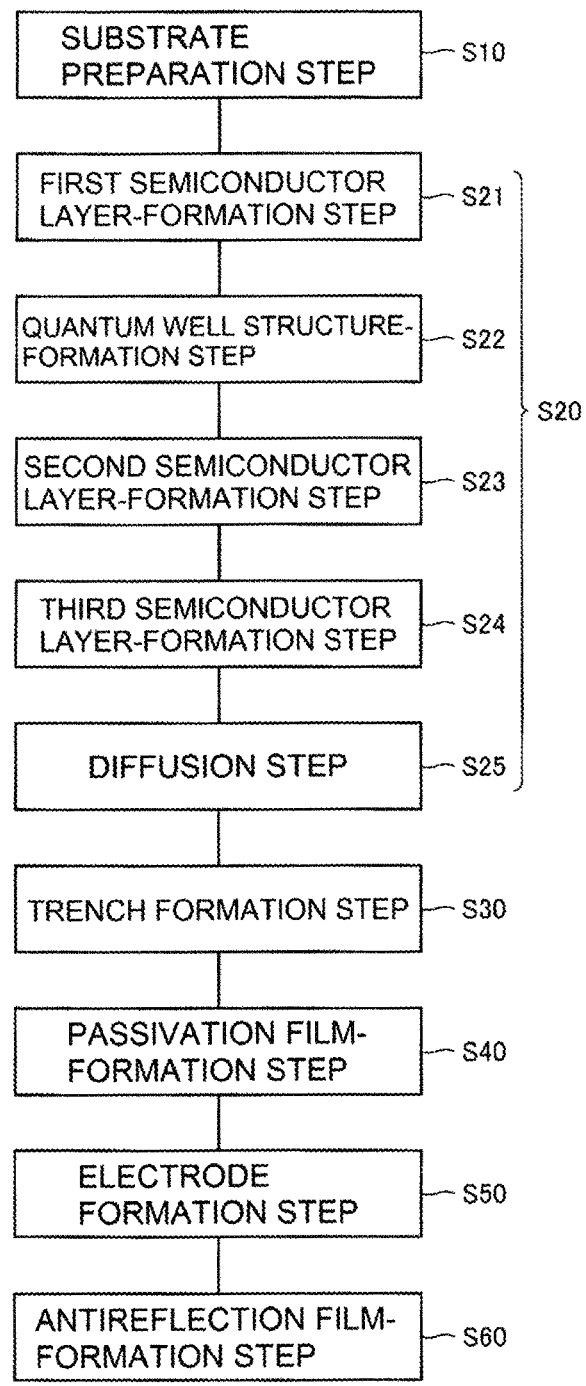
FIG. 3 is a flowchart illustrating the outline of a method for producing the semiconductor stacked body and the light-receiving element according to the first embodiment.
Figure 4:
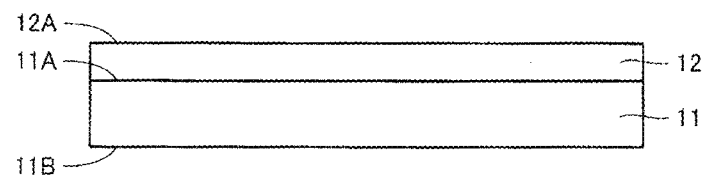
FIG. 4 is a schematic sectional view for describing a method for producing the semiconductor stacked body and the light-receiving element according to the first embodiment.
Figure 5:
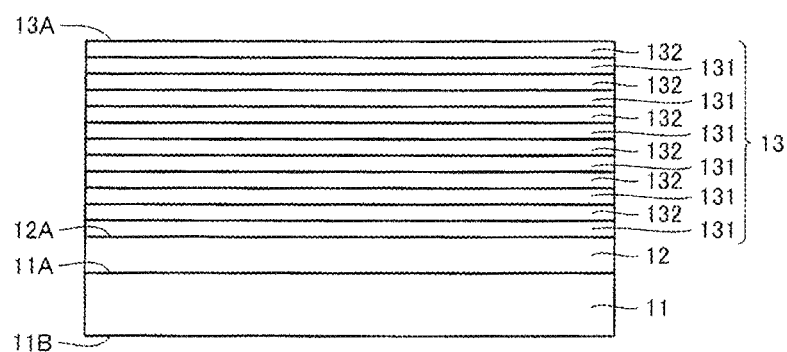
FIG. 5 is a schematic sectional view for describing the method for producing the semiconductor stacked body and the light-receiving element according to the first embodiment.
Figure 6:
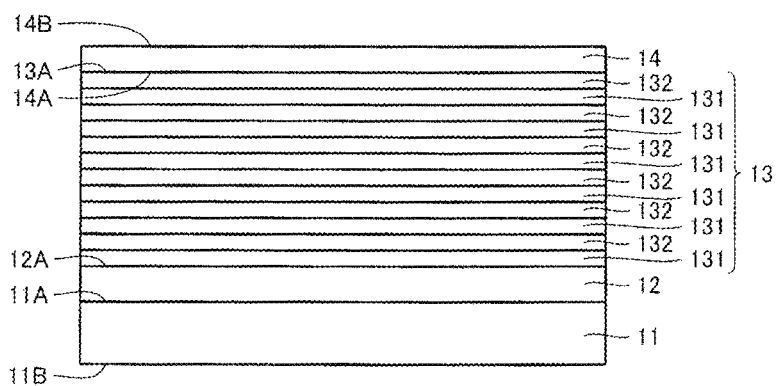
FIG. 6 is a schematic sectional view for describing the method for producing the semiconductor stacked body and the light-receiving element according to the first embodiment.
Figure 7:
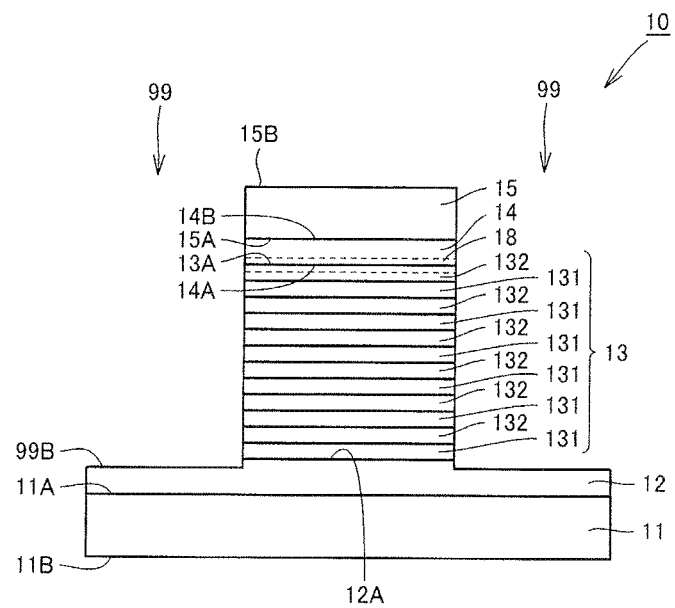
FIG. 7 is a schematic sectional view for describing the method for producing the semiconductor stacked body and the light-receiving element according to the first embodiment.
Figure 8:
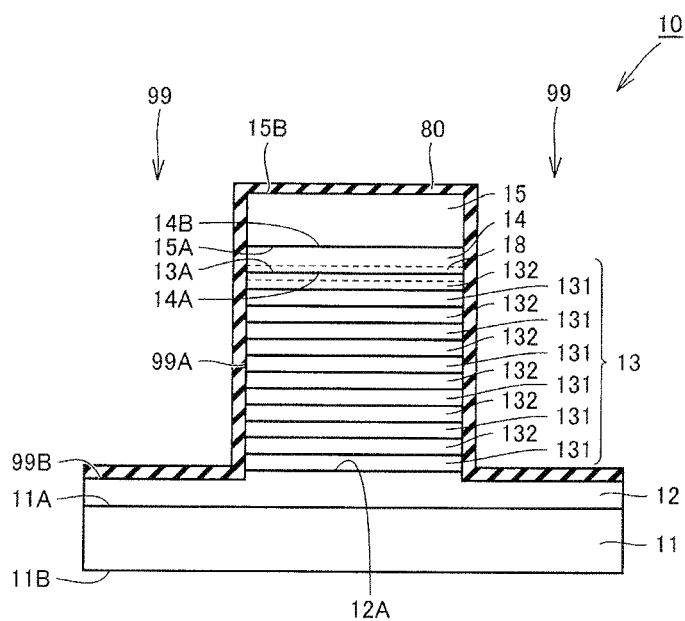
FIG. 8 is a schematic sectional view for describing the method for producing the semiconductor stacked body and the light-receiving element according to the first embodiment.

Referring to FIG. 3, in the method for producing the semiconductor stacked body 10 and the infrared light-receiving element 1 in this embodiment, a substrate preparation step is first performed as a step (S10). In the step (S10), referring to FIG. 4, for example, a substrate 11 having a diameter of 2 inches (50.8 mm) and containing InP is prepared. More specifically, an ingot containing InP is sliced to provide a substrate 11 containing InP. The surface of the substrate 11 is polished and then subjected to processes such as cleaning to provide the substrate 11 having a main surface 11A with flatness and cleanliness.

Next, an operation layer-formation step is performed as a step (S20). In the step (S20), a first semiconductor layer 12, a quantum well structure 13, a second semiconductor layer 14, and a third semiconductor layer 15 are formed as operation layers on the main surface 11A of the substrate 11 prepared in the step (S10). These operation layers can be formed by using, for example, metalorganic vapor phase epitaxy. The formation of the operation layers using metalorganic vapor phase epitaxy can be performed by, for example, placing the substrate 11 on a rotary table equipped with a heater for heating a substrate, and supplying source gases onto the substrate while the substrate 11 is heated with the heater.

The step (S20) includes a first semiconductor layer-formation step (S21), a quantum well structure-formation step (S22), a second semiconductor layer-formation step (S23), a third semiconductor layer-formation step (S24), and a diffusion step (S25).

In the step (S20), the step (S21) is first performed. In the step (S21), referring to FIG. 4, the first semiconductor layer 12 containing, for example, n-InGaAs, which is a group III-V compound semiconductor, is formed on and in contact with the main surface 11A of the substrate 11 by using metalorganic vapor phase epitaxy. In the formation of the first semiconductor layer 12 containing n-InGaAs, for example, TMIn (trimethylindium) and TEIn (triethylindium) can be used as an In source; for example, TEGa (triethylgallium) and TMGa (trimethylgallium) can be used as a Ga source; and, for example, TBAs (tertiary-butyl arsine) and TMAs (trimethylarsine) can be used as an As source.

Next, the step (S22) is performed. In the step (S22), referring to FIG. 4 and FIG. 5, a quantum well structure 13 is formed by, for example, alternately stacking a first element layer 131 containing $In_xGa_{1-x}As$ (x is 0.38 or more and 1 or less), which is a group III-V compound semiconductor, and a second element layer 132 containing $GaAs_{1-y}Sb_y$ (y is 0.36 or more and 1 or less), which is a group III-V compound semiconductor, such that the quantum well structure is formed on and in contact with a first main surface 12A of the first semiconductor layer 12 opposite to a surface that faces the substrate 11. The formation of the quantum well structure 13 can be performed by using metalorganic vapor phase epitaxy following the formation of the first semiconductor layer 12. In other words, the formation of the quantum well structure 13 can be performed by changing a source gas while the substrate 11 is placed in the apparatus used to form the first semiconductor layer 12. The quantum well structure 13 is formed to have a thickness of 0.5 μm or more.

In the formation of the first element layer 131 containing $In_xGa_{1-x}As$ (x is 0.38 or more and 1 or less), for example, TMIn and TEIn can be used as an In source; for example, TEGa and TMGa can be used as a Ga source; and, for example, TBAs and TMAs can be used as an As source. In the formation of the second element layer 132 containing $GaAs_{1-y}Sb_y$ (y is 0.36 or more and 1 or less), for example, TEGa and TMGa can be used as a Ga source; for example, TBAs and TMAs can be used as an As source; and, for example, TMSb (trimethylantimony), TESb (triethylantimony), TIPSb (triisopropylantimony), TDMASb (tridimethylaminoantimony), and TTBSb (tritertiarybutylantimony) can be used as a Sb source. The quantum well structure 13 that is a type-II quantum well can be formed accordingly.

Next, the step (S23) is performed. In the step (S23), referring to FIG. 5 and FIG. 6, the second semiconductor layer 14 containing, for example, InGaAs, which is a group III-V compound semiconductor, is formed on and in contact with a main surface 13A of the quantum well structure 13 opposite to a surface that faces the first semiconductor layer 12. The formation of the second semiconductor layer 14 can be performed by using metalorganic vapor phase epitaxy following the formation of the quantum well structure 13. The formation of the second semiconductor layer 14 can be performed by using a procedure similar to that for the first semiconductor layer 12 without introduction of a source gas for adding an n-type impurity. In other words, the second semiconductor layer 14 can be formed as an undoped semiconductor layer containing InGaAs.

Next, the step (S24) is performed. In the step (S24), referring to FIG. 6 and FIG. 1, the third semiconductor layer 15 containing, for example, p-InP, which is a group III-V compound semiconductor whose conductivity type is p-type, is formed on and in contact with a main surface 14B of the second semiconductor layer 14 opposite to a surface that faces the quantum well structure 13. The formation of the third semiconductor layer 15 can be performed by using metalorganic vapor phase epitaxy following the formation of the second semiconductor layer 14.

In the step (S24), the third semiconductor layer 15 may be formed such that the p-type impurity contained in the third semiconductor layer 15 diffuses into the second semiconductor layer 14. Specifically, the third semiconductor layer 15 is formed at a temperature at which Zn introduced as a p-type impurity into the third semiconductor layer 15 can diffuse into the second semiconductor layer 14.

Next, the step (S25) is performed. In the step (S25), the p-type impurity contained in the third semiconductor layer 15 is diffused into the second semiconductor layer 14 by a heat treatment. The heat treatment involves, for example, heating to a temperature of 400° C. or higher and 700° C. or lower and maintaining the temperature for 10 minutes or longer and 120 minutes or shorter. The step (S25) is not an essential step in the method for producing the semiconductor stacked body 10, but the step (S25) facilitates the control of the concentration of the p-type impurity contained in the second semiconductor layer 14.

The process from the step (S10) to the step (S20) provides the semiconductor stacked body 10 of this embodiment including the second semiconductor layer 14 having a p-type impurity concentration of $1 \times 10^{14}$ cm$^{-3}$ or more and $1 \times 10^{17}$ cm$^{-3}$ or less (or $1 \times 10^{14}$ cm$^{-3}$ or more and $1 \times 10^{16}$ cm$^{-3}$ or less). The p-type impurity (e.g., Zn) that has diffused from the third semiconductor layer 15 into the second semiconductor layer 14 accumulates near the interface between the quantum well structure 13 and the second semiconductor layer 14. As a result, an interface region 18 is formed so as to include the interface 13 between the quantum well structure 13 and the second semiconductor layer 14. The interface region 18 has a higher p-type impurity concentration than a region in the quantum well structure 13 and a region in the second semiconductor layer 14, these regions being adjacent to the interface region 18. The p-type impurity concentration of the interface region 18 is, for example, $1 \times 10^{15}$ cm$^{-3}$ or more and $1 \times 10^{18}$ cm$^{-3}$ or less.

The production efficiency of the semiconductor stacked body 10 can be improved by performing the step (S20) using metalorganic vapor phase epitaxy as described above. The step (S20) is not limited to metalorganic vapor phase epitaxy using only metalorganic sources (metalorganic vapor phase epitaxy with all metalorganic sources). The step (S20) may be performed by using, for example, metalorganic vapor phase epitaxy with hydrides, such as $AsH_3$ (arsine) for an As source and $SiH_4$ (silane) for a Si source. However, metalorganic vapor phase epitaxy with all metalorganic sources can provide the semiconductor stacked body 10 containing high quality crystals. The semiconductor stacked body 10 can be produced by using a method other than metalorganic vapor phase epitaxy. For example, molecular beam epitaxy (MBE) may be employed.

The step (S20) is preferably performed continuously by changing a source gas while the substrate 11 is placed in the apparatus as described above. Specifically, the step (S20) is preferably performed such that the first semiconductor layer 12, the quantum well structure 13, the second semiconductor layer 14, and the third semiconductor layer 15 are stacked without formation of a regrown interface. The dark current can be reduced accordingly.

Referring to FIG. 3, a trench formation step is next performed as a step (S30). In the (S30), referring to FIG. 1 and FIG. 7, a trench 99 is formed in the semiconductor stacked body 10 produced in the steps (S10) to (S20). The trench 99 passes through the third semiconductor layer 15, the second semiconductor layer 14, and the quantum well structure 13 and reaches the first semiconductor layer 12. The trench 99 can be formed as follows: for example, forming a mask layer on the main surface 15B of the third semiconductor layer 15, the mask layer having an opening corresponding to the shape of the trench 99; and then performing etching.

Next, a passivation film-formation step is performed as a step (S40). In the step (S40), referring to FIG. 7 and FIG. 8, a passivation film 80 is formed on the semiconductor stacked body 10 having the trench 99 formed in the step (S30). Specifically, a passivation film 80 containing an insulating material, such as silicon oxide or silicon nitride, is formed by using, for example, chemical vapor deposition (CVD). The passivation film 80 is formed to cover the bottom wall 99B of the trench 99, the side wall 99A of the trench 99, and the main surface 15B of the third semiconductor layer 15 opposite to the surface that faces the second semiconductor layer 14.

Next, an electrode formation step is performed as a step (S50). In the step (S50), referring to FIG. 8 and FIG. 2, an n-side electrode 91 and a p-side electrode 92 are formed on the semiconductor stacked body 10 having the passivation film 80 formed in the step (S40). Specifically, for example, a mask having openings at the positions corresponding to the regions where the n-side electrode 91 and the p-side electrode 92 are to be formed is formed on the passivation film 80. Using the mask, openings 81 and 82 are formed in the passivation film 80. Subsequently, the n-side electrode 91 and the p-side electrode 92 each containing a suitable conductive material are formed by using, for example, vapor deposition. The above-described steps provide infrared light-receiving elements 1 in this embodiment. The infrared light-receiving elements 1 are then separated into individual elements through, for example, dicing.

(Second Embodiment)

Figure 9:
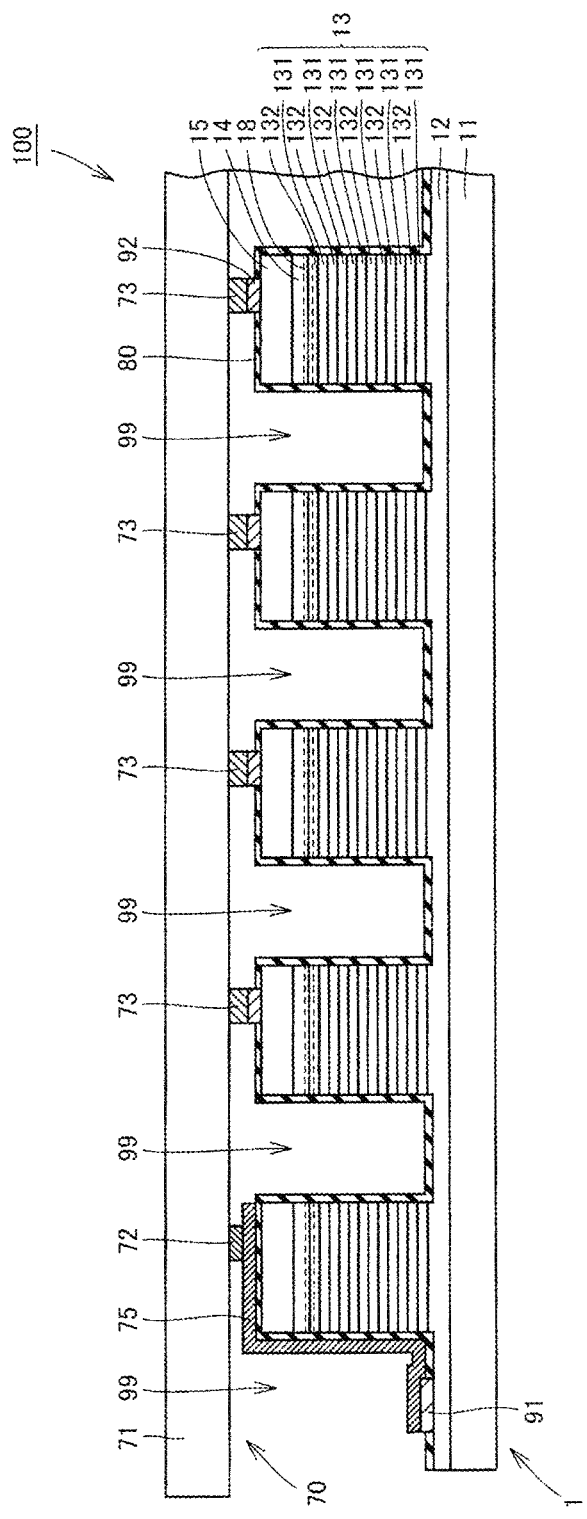
FIG. 9 is a schematic sectional view illustrating the structure of a light-receiving element and a sensor according to a second embodiment.

Next, a light-receiving element and a sensor in a second embodiment, which is another embodiment of a light-receiving element according to the present invention, will be described. Referring to FIG. 9 and FIG. 2, an infrared light-receiving element 1 in the second embodiment includes plural unit structures each illustrated in FIG. 2. The unit structure is repeated in the direction in which one main surface 11A of the substrate 11 extends. The infrared light-receiving element 1 has plural p-side electrodes 92 corresponding to the respective pixels. The infrared light-receiving element 1 has only one n-side electrode 91.

More specifically, referring to FIG. 9, the n-side electrode 91 of the infrared light-receiving element 1 according to the second embodiment is formed on the bottom wall of the trench 99 located at an end in the direction in which the substrate 11 extends. The p-side electrode 92 on the third semiconductor layer 15 adjacent to the trench 99 located at the end is not shown. An infrared sensor 100 according to this embodiment includes the infrared light-receiving element 1 having such a structure, and a read-out integrated circuit (ROIC) 70 electrically coupled to the infrared light-receiving element 1. The read-out integrated circuit 70 is, for example, a complementary metal oxide semiconductor (CMOS) circuit.

Plural read-out electrodes (not shown) in a body 71 of the read-out integrated circuit 70 are electrically coupled respectively to plural p-side electrodes 92 with bumps 73 interposed therebetween. The p-side electrodes 92 function as pixel electrodes in the infrared light-receiving element 1. The infrared light-receiving element 1 has a wiring line 75 in contact with the n-side electrode 91. The wiring line 75 extends along the bottom wall and the side wall of the trench 99 in which the n-side electrode 91 is located, and the wiring line 75 reaches the top of the third semiconductor layer 15. The wiring line 75 and a grounding electrode (not shown) provided in the body 71 of the read-out integrated circuit 70 are electrically coupled to each other with a bump 72 interposed therebetween. With such a structure, received-light information for each pixel of the infrared light-receiving element 1 is outputted to the read-out electrode of the read-out integrated circuit 70 from each p-side electrode 92 (pixel electrode), and the received-light information is collected in the read-out integrated circuit 70 to form, for example, a two-dimensional image.

EXAMPLES

Example 1

The relationship between the impurity concentration of the second semiconductor layer and the sensitivity was experimentally investigated. The experimental procedure was as described below.

An infrared light-receiving element 1 having the same structure as that in the first embodiment was produced. The compound semiconductor in a substrate 11 was n-InP (impurity: S). The compound semiconductor in a first semiconductor layer 12 was n-InGaAs doped with $1 \times 10^{18}$ cm$^{-3}$ of Si as an n-type impurity. The thickness of the first semiconductor layer 12 was 150 nm. The compound semiconductor in a first element layer 131 in a quantum well structure 13 was InGaAs, and the compound semiconductor in a second element layer 132 was GaAsSb. The thickness of the first element layer 131 and the second element layer 132 each was 5 nm. The quantum well structure 13 was a type-II quantum well structure including a stack of 250 unit structures each including the first element layer 131 and the second element layer 132.

The compound semiconductor in a second semiconductor layer 14 was InGaAs. The thickness of the second semiconductor layer 14 was 1 μm. The second semiconductor layer 14 contained Zn, which was a p-type impurity introduced as a result of the diffusion from the third semiconductor layer 15. The compound semiconductor in a third semiconductor layer 15 was p-InP doped with $5 \times 10^{18}$ cm$^{-3}$ of Zn as a p-type impurity. The thickness of the third semiconductor layer 15 was 0.8 μm. Infrared light-receiving elements 1 in which the concentrations of Zn, a p-type impurity, in the second semiconductor layer 14 were different were produced, and the sensitivity was experimentally investigated.

The impurity concentration of each layer was measured using a double-focusing magnetic sector SIMS (secondary ion mass spectrometer). In sputtering for analysis using SIMS, cesium ions (Cs$^+$) were used. The accelerating voltage of cesium ions was set to 5 keV. The beam diameter was 20 μm or less. The raster region was a square region with 150 μm sides. The analyzed region was a circular region 60 μm in diameter. The degree of vacuum during measurement was $1 \times 10^{-7}$ Pa. The sensitivity was measured by injecting light with a wavelength of 2.2 μm from the substrate 11 side under the conditions of a reverse bias of 2 V and a measurement temperature of −50° C. The measurement results are shown in Table 1.

TABLE 1

| p-Type impurity concentration (cm$^{-3}$) | Sensitivity (A/W) | Rating |
| --- | --- | --- |
| $5 \times 10^{17}$ | 0.5 | C |
| $1 \times 10^{17}$ | 0.9 | B |
| $5 \times 10^{16}$ | 1.0 | B |
| $1 \times 10^{16}$ | 1.1 | B |
| $5 \times 10^{15}$ | 1.2 | B |
| $1 \times 10^{15}$ | 1.4 | A |
| $5 \times 10^{14}$ | 1.2 | B |
| $1 \times 10^{14}$ | 1.1 | B |
| $5 \times 10^{13}$ | 0.6 | C |

Table 1 shows the relationship between the p-type impurity concentration of the second semiconductor layer 14 and the sensitivity. In Table 1, excellent sensitivity is rated A, good sensitivity B, and poor sensitivity C.

Referring to Table 1, the sensitivity is poor when the p-type impurity concentration of the second semiconductor layer 14 is less than $1 \times 10^{14}$ cm$^{-3}$. The reason for this may be that carriers are generated in the second semiconductor layer 14 because the second semiconductor layer 14 with a low p-type impurity concentration is disposed between the quantum well structure 13 and the third semiconductor layers 15 which functions as a contact layer. The sensitivity is also poor when the p-type impurity concentration of the second semiconductor layer 14 is more than $1 \times 10^{17}$ cm$^{-3}$. The reason for this may be that a high p-type impurity concentration in the second semiconductor layer 14 causes generation of carriers in the second semiconductor layer 14 due to the p-type impurity. When the p-type impurity concentration of the second semiconductor layer 14 is $1 \times 10^{14}$ cm$^{-3}$ or more and $1 \times 10^{17}$ cm$^{-3}$ or less, good sensitivity is obtained. When the p-type impurity concentration is $1 \times 10^{15}$ cm$^{-3}$, excellent sensitivity is obtained. The reason for this may be that the generation of carriers as described above is reduced in the second semiconductor layer 14 by controlling the p-type impurity concentration in a suitable range.

The above results indicate that the p-type impurity concentration of the second semiconductor layer 14 should be $1 \times 10^{14}$ cm$^{-3}$ or more and $1 \times 10^{17}$ cm$^{-3}$ or less.

Example 2

The relationship between the impurity concentration of the interface region and the sensitivity was experimentally investigated. The experimental procedure was as described below.

Samples of the infrared light-receiving element 1 which were similar to those in Example 1 and which have different concentrations of Zn, a p-type impurity, in the interface region 18 were prepared, and the sensitivity was experimentally investigated. The sensitivity was measured in the same manner as that in Example 1. The measurement results are shown in Table 2.

TABLE 2

| p-Type impurity concentration (cm$^{-3}$) | Sensitivity (A/W) | Rating |
|---|---|---|
| 1 × 10$^{18}$ | 1.2 | B |
| 5 × 10$^{16}$ | 1.4 | A |
| 1 × 10$^{15}$ | 1.1 | B |

Table 2 shows the relationship between the p-type impurity concentration of the interface region 18 and the sensitivity. In Table 2, the sensitivity is rated in the same manner as that in Table 1.

Referring to Table 2, good sensitivity is obtained when the p-type impurity concentration of the interface region 18 is 1×10$^{15}$ cm$^{-3}$ or more and 1×10$^{18}$ cm$^{-3}$ or less. Excellent sensitivity is obtained when the p-type impurity concentration is 5×10$^{16}$ cm$^{-3}$. The reason for this may be that generation of carriers at the interface between the second semiconductor layer 14 and the quantum well structure 13 is reduced by controlling the p-type impurity concentration in a suitable range.

The above results indicate that the p-type impurity concentration of the interface region 18 is preferably 1×10$^{15}$ cm$^{-3}$ or more and 1×10$^{18}$ cm$^{-3}$ or less.

Example 3

The relationship between the impurity concentration of the third semiconductor layer and the sensitivity was experimentally investigated. The experimental procedure was as described below.

Samples of the infrared light-receiving element 1 which were similar to those in Example 1 and which have different concentrations of Zn, a p-type impurity, in the third semiconductor layer 15 were prepared, and the sensitivity was experimentally investigated. The sensitivity was measured in the same manner as that in Example 1. The measurement results are shown in Table 3.

TABLE 3

| p-Type impurity concentration (cm$^{-3}$) | Sensitivity (A/W) | Rating |
|---|---|---|
| 1 × 10$^{20}$ | 1.2 | B |
| 1 × 10$^{19}$ | 1.2 | B |
| 1 × 10$^{18}$ | 1.1 | B |

Table 3 shows the relationship between the p-type impurity concentration of the third semiconductor layer 15 and the sensitivity. In Table 3, the sensitivity is rated in the same manner as that in Table 1.

Referring to Table 3, good sensitivity is obtained when the p-type impurity concentration of the third semiconductor layer 15 is 1×10$^{18}$ cm$^{-3}$ or more and 1×10$^{20}$ cm$^{-3}$ or less. The reason for this may be that the p-type impurity concentration of the second semiconductor layer 14 is maintained in a suitable range by controlling the p-type impurity concentration of the third semiconductor layer 15 in a suitable range.

The above results indicate that the p-type impurity concentration of the third semiconductor layer 15 is preferably 1×10$^{18}$ cm$^{-3}$ or more and 1×10$^{20}$ cm$^{-3}$ or less.

Example 4

The relationship between the impurity concentration of the quantum-well light-receiving layer and the sensitivity was experimentally investigated. The experimental procedure was as described below.

Samples of the infrared light-receiving element 1 which were similar to those in Example 1 and which have different concentrations of Zn, a p-type impurity, in the quantum well structure 13 were prepared, and the sensitivity was experimentally investigated. The sensitivity was measured in the same manner as that in Example 1. The measurement results are shown in Table 4.

TABLE 4

| p-Type impurity concentration (cm$^{-3}$) | Sensitivity (A/W) | Rating |
|---|---|---|
| 1 × 10$^{17}$ | 0.9 | B |
| 5 × 10$^{16}$ | 1.0 | B |
| 1 × 10$^{16}$ | 1.1 | B |
| 5 × 10$^{15}$ | 1.2 | B |
| 1 × 10$^{15}$ | 1.5 | A |
| 5 × 10$^{14}$ | 1.2 | B |
| 1 × 10$^{14}$ | 1.1 | B |

Table 4 shows the relationship between the p-type impurity concentration of the quantum well structure 13 and the sensitivity. In Table 4, the sensitivity is rated in the same manner as that in Table 1.

Referring to Table 4, good sensitivity is obtained when the p-type impurity concentration of the quantum well structure 13 is 1×10$^{14}$ cm$^{-3}$ or more and 1×10$^{17}$ cm$^{-3}$ or less. When the p-type impurity concentration is 1×10$^{15}$ cm$^{-3}$, excellent sensitivity is obtained. The reason for this may be that n-type carriers generated in the quantum well structure 13 are compensated by controlling the p-type impurity concentration in a suitable range, resulting in a low carrier concentration of the quantum well structure 13.

The above results indicate that the p-type impurity concentration of the quantum well structure 13 is preferably 1×10$^{14}$ cm$^{-3}$ or more and 1×10$^{17}$ cm$^{-3}$ or less.

Example 5

The relationship between the sensitivity and the conditions of the heat treatment carried out after the formation of the third semiconductor layer was experimentally investigated. The experimental procedure was as described below.

The infrared light-receiving elements 1 similar to those in Example 1 were produced by following a procedure similar to that in the method for producing an infrared light-receiving element in the embodiment. In the procedure, the heating temperature and the heating time in the diffusion step performed as the step (S25) were changed, and the sensitivity of the obtained infrared light-receiving elements was investigated. The sensitivity was measured in the same manner as that in Example 1. The measurement results are shown in Table 5.

TABLE 5

| | | Time (min.) | | | |
|---|---|---|---|---|---|
| | | 5 | 10 | 120 | 180 |
| Temp (° C.) | 350 | 0.4 A/W | 0.4 A/W | 0.4 A/W | 0.4 A/W |
| | 400 | 0.5 A/W | 1.1 A/W | 1.2 A/W | 0.7 A/W |

TABLE 5-continued

| | Time (min.) | | | |
|---|---|---|---|---|
| | 5 | 10 | 120 | 180 |
| 700 | 0.7 A/W | 1.2 A/W | 1.1 A/W | 0.4 A/W |
| 750 | 0.4 A/W | 0.4 A/W | 0.3 A/W | 0.2 A/W |

Table 5 shows the relationship between the sensitivity and the heat treatment temperature and the heat treatment time in the step (S25).

Referring to Table 5, a good sensitivity of 1.0 A/W or higher is obtained when the heat treatment temperature is 400° C. or higher and 700° C. or lower and the heat treatment time is 10 minutes or longer and 120 minutes or shorter. The reason for this may be that, in the range of the temperature and the time of the heat treatment, the second semiconductor layer 14 having a suitable p-type impurity concentration is obtained as a result of the diffusion of a suitable amount of a p-type impurity (Zn) from the third semiconductor layer 15 into the second semiconductor layer 14.

The above results indicate that the heat treatment carried out after the formation of the third semiconductor layer preferably involves heating to a temperature of 400° C. or higher and 700° C. or lower and maintaining the temperature for 10 minutes or longer and 120 minutes or shorter.

It should be understood that the embodiments and Examples disclosed herein are illustrative and non-restrictive in any respect. The scope of the present invention is defined by the claims, rather than the description above, and is intended to include all modifications within the meaning and range of equivalency of the claims.

REFERENCE SIGNS LIST

1 Infrared light-receiving element
10 Semiconductor stacked body
11 Substrate
11A Main surface
12 First semiconductor layer
12A First main surface
13 Quantum well structure
131 First element layer
132 Second element layer
13A Main surface
14 Second semiconductor layer
14A Main surface
14B Main surface
15 Third semiconductor layer
15A Main surface
15B Main surface
18 Interface region
70 Read-out integrated circuit
71 Body
72, 73 Bump
75 Wiring line
80 Passivation film
81, 82 Opening
91 n-side electrode
92 p-side electrode
99 Trench
99A Side wall
99B Bottom wall
100 Infrared sensor

The invention claimed is:

1. A semiconductor stacked body comprising:
a first semiconductor layer containing a group III-V compound semiconductor and being a layer whose conductivity type is a first conductivity type;
a quantum-well light-receiving layer containing a group III-V compound semiconductor;
a second semiconductor layer containing a group III-V compound semiconductor;
a third semiconductor layer containing a group III-V compound semiconductor and being a layer whose conductivity type is a second conductivity type different from the first conductivity type, and
a trench that passes through the second semiconductor layer and the quantum-well-light-receiving layer, and reaches the first semiconductor layer, wherein
the first semiconductor layer, the quantum-well light-receiving layer, the second semiconductor layer, and the third semiconductor layer are stacked in this order, and
a concentration of an impurity that generates a carrier of the second conductivity type is $1\times10^{14}$ $cm^{-3}$ or more and $1\times10^{17}$ $cm^{-3}$ or less in the second semiconductor layer.

2. The semiconductor stacked body according to claim 1, wherein an interface region, which is a region including an interface between the quantum-well light-receiving layer and the second semiconductor layer, has a higher concentration of the impurity that generates a carrier of the second conductivity type than a region in the quantum-well light-receiving layer and a region in the second semiconductor layer, these regions being adjacent to the interface region.

3. The semiconductor stacked body according to claim 2, wherein, in the interface region, the concentration of the impurity that generates a carrier of the second conductivity type is $1\times10^{15}$ $cm^{-3}$ or more and $1\times10^{18}$ $cm^{-3}$ or less.

4. The semiconductor stacked body according to claim 1, wherein, in the third semiconductor layer, the concentration of the impurity that generates a carrier of the second conductivity type is $1\times10^{18}$ $cm^{-3}$ or more and $1\times10^{20}$ $cm^{-3}$ or less.

5. The semiconductor stacked body according to claim 1, wherein the impurity that generates a carrier of the second conductivity type in the third semiconductor layer is one or more selected from the group consisting of Si, S, Se, Ge, Te, and Sn, or one or more selected from the group consisting of Zn, Be, Mg, and C.

6. The semiconductor stacked body according to claim 1, wherein the third semiconductor layer contains InP.

7. The semiconductor stacked body according to claim 1, wherein the quantum-well light-receiving layer contains an impurity at a concentration of $1\times10^{14}$ $cm^{-3}$ or more and $1\times10^{17}$ $cm^{-3}$ or less, the impurity being an impurity that generates a carrier of the first conductivity type or an impurity that generates a carrier of the second conductivity type.

8. The semiconductor stacked body according to claim 1, wherein the quantum-well light-receiving layer has a thickness of 0.5 μm or more.

9. The semiconductor stacked body according to claim 1, wherein the quantum-well light-receiving layer has a type-II quantum well structure.

10. The semiconductor stacked body according to claim 1, wherein the quantum-well light-receiving layer has a multiple quantum well structure including a pair of an $In_xGa_{1-x}As$ (x is 0.38 or more and 1 or less) layer and a $GaAs_{1-y}Sb_y$ (y is 0.36 or more and 1 or less) layer or a pair of a $Ga_{1-u}In_uN_vAs_{1-v}$ (u is 0.4 or more and 0.8 or less, and v is more than 0 and 0.2 or less) layer and a $GaAs_{1-y}Sb_y$ (y is 0.36 or more and 0.62 or less) layer.

11. The semiconductor stacked body according to claim 10, further comprising a substrate disposed on an opposite side of the first semiconductor layer from the quantum-well light-receiving layer,
wherein the substrate contains GaAs, GaP, GaSb, InP, InAs, InSb, AlSb, or Al As.

12. The semiconductor stacked body according to claim 1, further comprising a substrate disposed on an opposite side of the first semiconductor layer from the quantum-well light-receiving layer,
wherein the second semiconductor layer contains a group III-V compound semiconductor capable of having a lattice constant equal to that of the substrate.

13. The semiconductor stacked body according to claim 1, wherein a concentration of oxygen, a concentration of carbon, and a concentration of hydrogen are each $10 \times^{17}$ $cm^{-3}$ or less at an interface between the first semiconductor layer and the quantum-well light-receiving layer, an interface between the quantum-well light-receiving layer and the second semiconductor layer, and an interface between the second semiconductor layer and the third semiconductor layer.

14. A light-receiving element comprising:
a plurality of the semiconductor stacked bodies according to claim 1; and
a plurality of electrodes, each formed on a respective semiconductor stacked body of the plurality of semiconductor stacked bodies,
wherein each of the semiconductor stacked bodies are separated by the trench.

15. A method for producing a semiconductor stacked body, comprising:
a step of forming a first semiconductor layer containing a group III-V compound semiconductor and being a layer whose conductivity type is a first conductivity type;
a step of forming a quantum-well light-receiving layer containing a group III-V compound semiconductor;
a step of forming a second semiconductor layer containing a group III-V compound semiconductor;
a step of forming a third semiconductor layer containing a group III-V compound semiconductor and being a layer whose conductivity type is a second conductivity type different from the first conductivity type, and
a step of forming a trench that passes through the second semiconductor layer and the quantum-well light-receiving layer, and reaches the first semiconductor layer, wherein
the step of forming a first semiconductor layer, the step of forming a quantum-well light-receiving layer, the step of forming a second semiconductor layer, and the step of forming a third semiconductor layer are performed in this order, and the first semiconductor layer, the quantum-well light-receiving layer, the second semiconductor layer, and the third semiconductor layer are stacked in this order, and
the second semiconductor layer is formed such that a concentration of an impurity that generates a carrier of the second conductivity type is $1 \times 10^{14}$ $cm^{-3}$ or more and $1 \times 10^{17}$ $cm^{-3}$ or less.

16. The method for producing a semiconductor stacked body according to claim 15, further comprising;
after the step of forming the third semiconductor layer, a step of diffusing an impurity contained in the third semiconductor layer into the second semiconductor layer by a heat treatment, the impurity being an impurity that generates a carrier of the second conductivity type,
wherein, in the step of forming the third semiconductor layer, the third semiconductor layer is formed such that an impurity contained in the third semiconductor layer diffuses into the second semiconductor layer, the impurity being an impurity that generates a carrier of the second conductivity type,
wherein the step of forming the first semiconductor layer, the step of forming the quantum-well light-receiving layer, the step of forming the second semiconductor layer, and the step of forming the third semiconductor layer are performed such that the first semiconductor layer, the quantum-well light-receiving layer, the second semiconductor layer, and third semiconductor layer are stacked without formation of a regrown interface,
wherein the step of forming the first semiconductor layer, the step of forming the quantum-well light-receiving layer, the step of forming the semiconductor layer, and the step of forming the third semiconductor layer are preformed by using metalorganic vapor phase epitaxy, and
wherein the heat treatment involves heating to temperature of 400° C. or higher and 700° C. or lower and maintaining the temperature for 10 minutes or longer and 120 minutes or shorter.

17. The semiconductor stacked body according to claim 1, wherein the trench has a side wall on which the first semiconductor layer, the second semiconductor layer, and the quantum-well light-receiving layer are exposed.

18. The semiconductor stacked body according to claim 1, wherein the trench has a bottom wall on which the first semiconductor layer is exposed.

19. The semiconductor stacked body according to claim 1, further comprising:
a passivation film;
a n-side electrode; and
a p-side electrode, wherein
the passivation film is disposed to cover a bottom wall of the trench, a side wall of the trench, and a main surface of the third semiconductor layer opposite to a surface that faces the second semiconductor layer.

20. The semiconductor stacked body according to claim 19,
wherein the passivation film has an opening that passes through the passivation film in the thickness direction, and
wherein one of the n-side electrode and the p-side electrode is disposed such that the opening is filled with the n-side electrode or the p-side electrode.

* * * * *

UNITED STATES PATENT AND TRADEMARK OFFICE
CERTIFICATE OF CORRECTION

PATENT NO. : 10,714,640 B2
APPLICATION NO. : 16/073039
DATED : July 14, 2020
INVENTOR(S) : Takuma Fuyuki et al.

It is certified that error appears in the above-identified patent and that said Letters Patent is hereby corrected as shown below:

In the Claims

At Column 20, Claim 1, Line 13, "type, and" should read --type; and--.

At Column 20, Claim 1, Line 15, "quantum-well-light-receiving" should read --quantum-well light-receiving--.

At Column 21, Claim 11, Line 9, "Al As" should read --AlAs--.

At Column 21, Claim 13, Line 19, "$10\times^{17}$" should read --$1\times 10^{17}$--.

At Column 22, Claim 16, Line 21, "layer, and third semiconductor" should read --layer, and the third semiconductor--.

Signed and Sealed this
Fifteenth Day of September, 2020

Andrei Iancu
*Director of the United States Patent and Trademark Office*